(12) United States Patent
Umeki

(10) Patent No.: US 6,249,134 B1
(45) Date of Patent: Jun. 19, 2001

(54) SEMICONDUCTOR INTEGRATED CIRCUIT DEVICE AND TESTING METHOD THEREOF

(75) Inventor: Yoshitaka Umeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/120,100

(22) Filed: Jul. 22, 1998

(30) Foreign Application Priority Data

Jul. 30, 1997 (JP) .................................................. 9-203681

(51) Int. Cl.[7] .................................................. G01R 31/28
(52) U.S. Cl. .......................................... 324/765; 324/763
(58) Field of Search .................................. 324/765, 763, 324/158.1; 714/733, 734

(56) References Cited

U.S. PATENT DOCUMENTS

| | | | |
|---|---|---|---|
| 5,519,335 | * | 5/1996 | Thomas ................................. 324/765 |
| 5,773,990 | * | 6/1998 | Wilstrup et al. ...................... 324/763 |
| 6,043,672 | * | 3/2000 | Sugasawara ......................... 324/765 |

FOREIGN PATENT DOCUMENTS

| | | |
|---|---|---|
| 1-169373 | 7/1989 | (JP) . |
| 5-136683 | 6/1993 | (JP) . |
| 7-229932 | 8/1995 | (JP) . |
| 7-301665 | 11/1995 | (JP) . |
| 8-29490 | 2/1996 | (JP) . |
| 9-159727 | 6/1997 | (JP) . |
| 9-186579 | 7/1997 | (JP) . |
| 10-106299 | 4/1998 | (JP) . |
| 10-209844 | 8/1998 | (JP) . |
| 10-300829 | 11/1998 | (JP) . |

OTHER PUBLICATIONS

B. Gunning et al., "A CMOS Low–Voltage–Swing Transmission–Line Transceiver", ISSCC92/Session 3/High Performance Circuits/Paper WP 3.7, (Month Unavailable), 1992, pp. 58–59.
"Solid–State Product Engineering Council", JEDEC, Jan. 1991, pp. 1–6.

* cited by examiner

Primary Examiner—Ernest Karlsen
(74) Attorney, Agent, or Firm—Sughrue, Mion, Zinn, Macpeak & Seas, PLLC

(57) ABSTRACT

A gunning transceiver logic input circuit is provided a construction, in which a high potential power source for a differential input circuit and a high potential power source for an internal CMOS circuit are mutually separated and independent of each other, upon performing an IDDQ test as a static current measuring test for an LSI including the differential input circuit flowing a steady-state current and an internal CMOS circuit not flowing the steady-state current. Upon IDDQ test, IDDQ test becomes possible to perform power supply from the power source independent from the power source of other CMOS circuit.

7 Claims, 4 Drawing Sheets

US 6,249,134 B1

SEMICONDUCTOR INTEGRATED CIRCUIT DEVICE AND TESTING METHOD THEREOF

BACKGROUND OF THE INVENTION

1. Field of the Invention

The present invention relates generally to a semiconductor integrated circuit device and a testing method therefor. More particularly, the invention relates to a semiconductor integrated circuit device loaded a differential circuit and a CMOS (Complementary Metal-Oxide Semiconductor) circuit and an IDDQ (Quiescent IDD) testing circuit therefor.

2. Description of the Related Art

In a CMOS LSI as a primary semiconductor integrated circuit, demands for higher density and higher speed have been growing. Particularly, a system frequency required for LSI has currently reached in an order of several hundreds MHz. An important task for satisfying such demand is how to improve operation frequency of an LSI output.

As one method for achieving the task, high speed circuits, such as GTL (Gunning Transceiver Logic) circuit, have been proposed. As to the GTL circuit, reference is made to "A CMOS Low-Voltage-Swing Transmission-Line Transceiver" in "ISSCC 92/SESSION 3/HIGH PERFORMANCE CIRCUITS/PAPER WP 3.7 (pp. 58 to 59) reported in IEEE INTERNATIONAL SOLID-STATE CIRCUIT CONFERENCE, 1992 and "Solid State Products Engineering Council", JEDEC, 1991 and so forth. Most of these circuits achieve high frequency output by making output amplitude smaller. Accordingly, a counterpart LSI input interfacing the LSI output has to be an input circuit corresponding to small amplitude.

FIG. 3 is an illustration showing a construction of an LSI loaded a GTL output circuit a. On an LSI 20, a GTL input circuit b is loaded. On the other hand, in a connection wire 30 connecting a GTL output circuit a and the GTL input circuit b, a terminal resistor R having relatively low resistance value is provided. Through the terminal resistor R, a terminal voltage VT is applied to the connection wire 30.

FIG. 4 is an illustration showing an example of the GTL input circuit b. The GTL input circuit b has a differential circuit construction consisted of P-type MOS transistors T1 and T2. Namely, on a gate of the transistor T1, an input Vin is supplied, and on a gate of the transistor T2, a reference voltage Vref is supplied, respectively. Between a common source of both transistors T1 and T2 and a high potential power source VDD, a P-type MOS transistor T3 is provided. To the gate of the transistor T3, the input Vin is supplied.

As drain loads of both transistors T1 and T2, a current mirror circuit consisted of N-type MOS transistors T4 and T5 is provided. An output Vout is lead from a drain of the transistor T2 via an inverter (generally a CMOS inverter) 1.

In the circuit constructed as set forth above, high frequency operation can be realized easily in comparison with a normal CMOS input circuit. The reason is as follows. A logic signal in the normal CMOS circuit corresponds to VDD (high potential power source voltage of the circuit) at high level, and to a ground level at low level. In contrast to this, the differential input circuit of FIG. 4 is operative at a high level corresponding to a voltage between VDD and Vref, and a low level corresponding to a voltage between Vref and the ground potential to assure stable operation even with a low amplitude input signal.

FIG. 5 shows one example of a relationship of voltage levels at respective parts in the construction of FIG. 3. In the shown example it is assumed that power source voltage VDD=5V, the terminal voltage VT=1.2V and the reference voltage Vref=0.8V. On the other hand, the GTL output circuit is operative between a high level normally being VT and a low level (Vol) normally in a range of 0 <Vol <0.4V. In the circuit construction shown in FIG. 4, a drain output of the transistor T2 applied the reference voltage Vref at the gate thereof is converted into a normal CMOS level by the inverter 1, and thereafter the signal is propagated within the LSI 20.

In the circuit of CMOS structure, while a through current flows upon variation of the signal, little current may flow in steady state. However, when a faulty portion is present in an internal circuit of the LSI and a short circuit is formed between the power source or the ground by such faulty portion, a current flows even in the steady state. Accordingly, testing whether failure is caused in an element of the internal circuit of the LSI or not, can be performed by measuring a consumed current in the steady state. This will be referred to as IDDQ test (static current consumption measuring test: Quiescent IDD test), which is new testing method recently introduced for improving failure detection ratio supplementing a function test employing a test pattern.

On the other hand, a differential circuit shown in FIG. 4 is normally constructed to flow a steady-state current. Therefore, in the steady state (static state) of the LSI, the current may flow in spite of the fact that the LSI operates normally. Therefore, a differential circuit having a circuit construction as shown in FIG. 6 can be considered. Namely, an enabling signal Ven is supplied to the gate of the P-type transistor T3 in the circuit of FIG. 4, and, by providing N-type transistor T6 between the drain of the transistor T2 and the ground, the enabling signal Ven is supplied to the gate of the transistor T6.

In the construction set forth above, by setting the enabling signal Ven at high level, the steady-state current can be cut. However, at this time, the output Vout is fixed at high level irrespective of the value of the input Vin. In a current cut state, IDDQ test can not be implemented by an optimal IDDQ test pattern.

In the conventional CMOS LSI loaded the differential circuit, it has not been possible to perform effective IDDQ test.

SUMMARY OF THE INVENTION

Therefore, it is an object of the present invention to provide a semiconductor integrated circuit device loaded a differential circuit flowing a current in a steady state, which can be implemented an appropriate IDDQ test.

It is another object of the present invention to provide a testing method for a CMOS LSI loaded a differential circuit flowing a current in a steady state, which can implement an appropriate IDDQ test.

According to the first aspect of the present invention, a semiconductor integrated circuit device including a differential circuit flowing a steady-state current and an internal circuit not flowing the steady-state current, comprises:

a high potential power source for the internal circuit; and a high potential power source for the differential circuit separately and independently.

In the preferred construction, a terminal for the high potential power source of the differential circuit and a terminal for the high potential power source of the internal circuit may be provided independently of each other. The differential circuit may be an input circuit inputting an output signal of other integrated circuit to the internal circuit as an input.

Preferably, the differential circuit is a gunning transceiver logic circuit. Also, the internal circuit may be a circuit of a CMOS structure. More preferably, the circuit of the CMOS structure is a CMOS inverter.

According to the second aspect of the present invention, a testing method for a semiconductor integrated circuit including a differential circuit flowing a steady-state current, a first terminal of the high potential power source of the differential circuit, and a second terminal for the high potential power source of the internal circuit, comprises:

first step supplying power source voltages to the first terminal and the second terminal from mutually independent power sources;

second step of performing a consumed current measuring test in the power source of the second terminal in a condition where power source voltages to the first terminal and the second terminal are supplied from mutually independent power sources.

The measuring test of the second step is preferably a measuring test of a static consumed current. In the preferred embodiment, after completing the measurement test of the second step, the first ands second terminals are connected in common.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
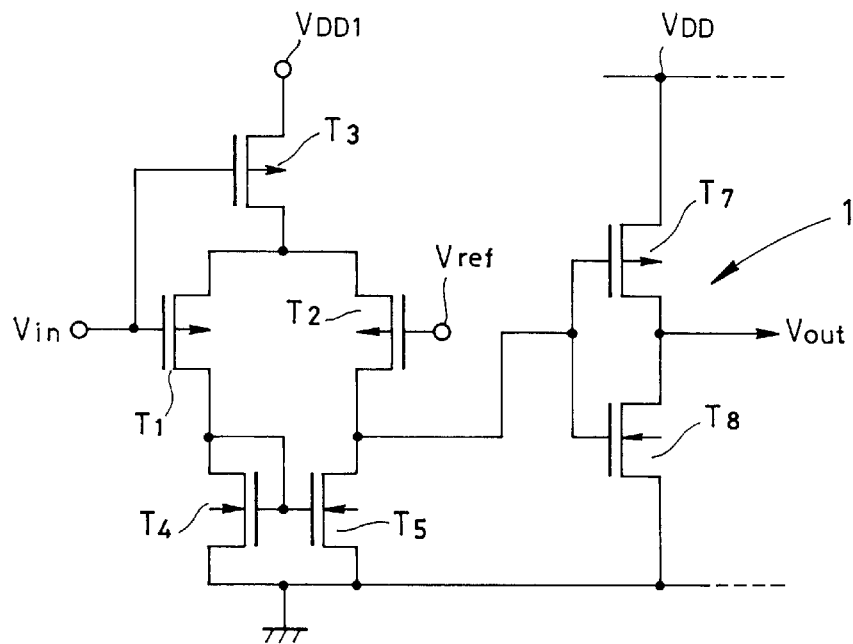
FIG. 1 is a circuit diagram showing the preferred embodiment of a semiconductor integrated circuit device according to the present invention.
Figure 4:
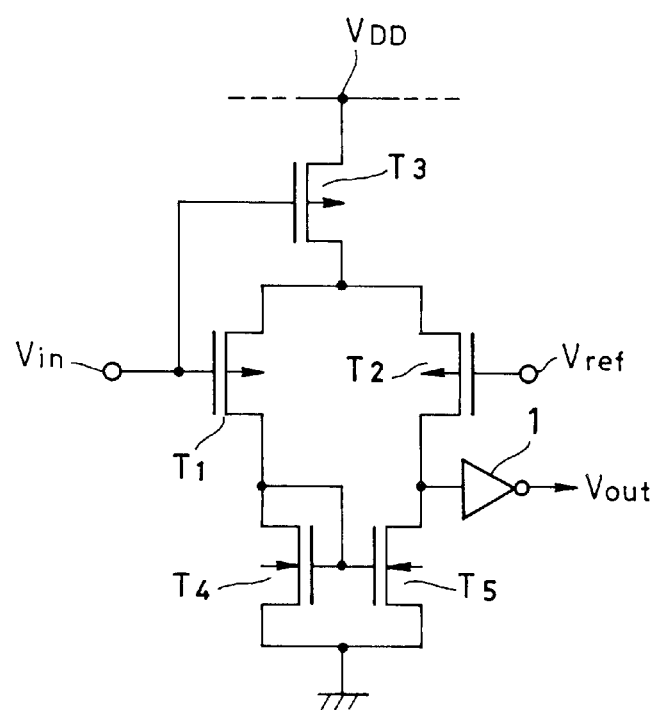
FIG. 4 is an illustration showing a construction of a differential circuit as the GTL circuit.
Figure 5:
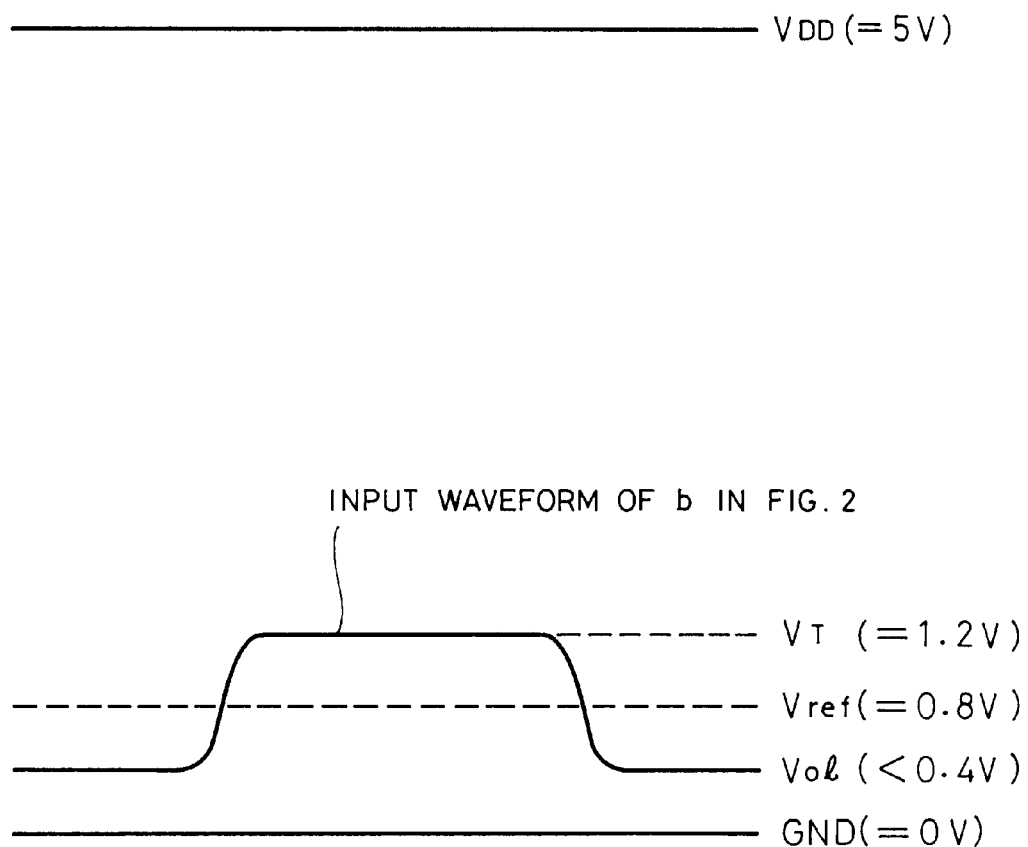
FIG. 5 is an illustration showing a signal waveform of the LSI and a relationship of voltages at respective portions.
Figure 6:
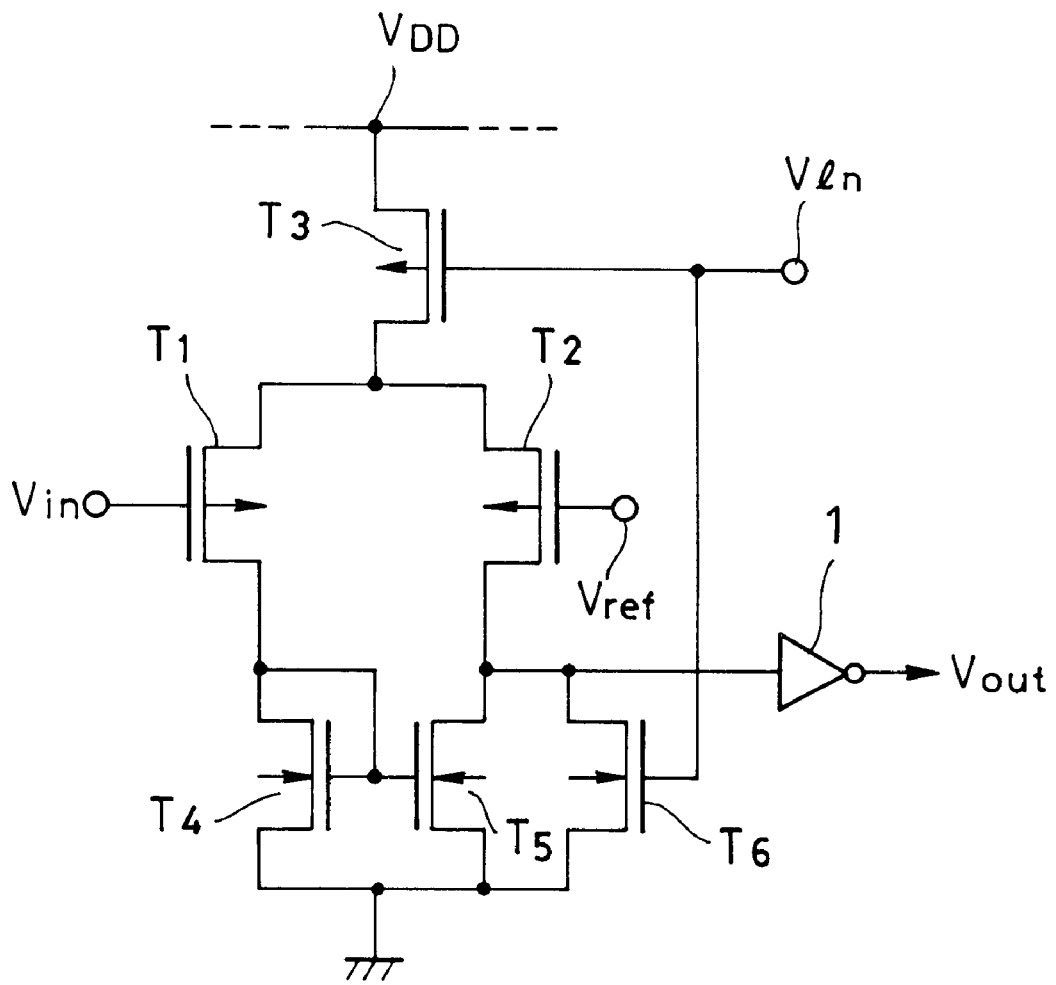
FIG. 6 is an illustration showing the example of construction of the differential circuit of the conventional GTL circuit.

FIG. 1 shows the preferred embodiment of a semiconductor integrated circuit device according to the present invention. In the following disclosure, like reference numerals identify like elements in FIG. 4 and detailed description for the common elements will be neglected in order to keep the disclosure simple enough by avoiding redundant discussion for facilitating the clear understanding of the present invention. Therefore, the following discussion will be concentrated to the portion different from that in FIG. 4. A high potential power source VDD1 of a differential input circuit as a GTL input circuit consisted of transistors T1 to T5 is provided separately and independently of a high potential power source VDD of an internal circuit (including an inverter 1) of another CMOS structure. Namely, external terminals for supplying power sources VDD1 and VDD are provided mutually independently.

An inverter 1 connected to an output portion of the differential input circuit is an inverter circuit of general CMOS structure which is consisted of a P-type MOS transistor T7 and an NMOS transistor T8. A level of the output Vout is converted into a CMOS level by the inverter 1.

Figure 2:
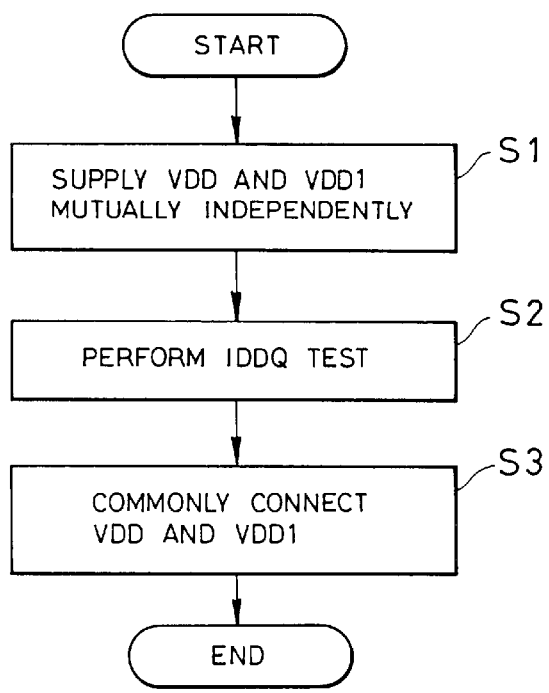
FIG. 2 is a flowchart showing the preferred embodiment of a testing method of the semiconductor integrated circuit device according to the present invention.
Figure 3:
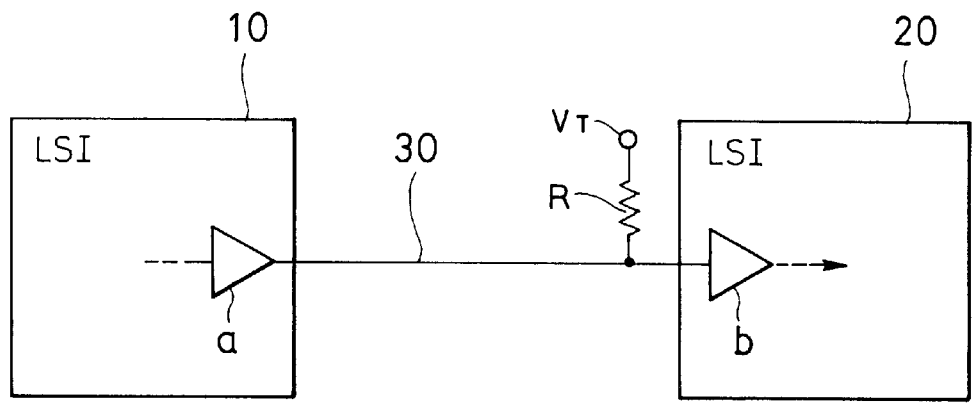
FIG. 3 is an illustration showing a construction of an LSI loaded a GTL circuit.

In an IDDQ test, as shown in a flowchart of FIG. 2, as an operational power source VDD1 of the differential input circuit flowing a current in a steady state, a power source different from operational power source VDD of other internal circuit, is supplied independently (step S1), and measurement of the IDDQ is performed (step S2). In this case, the operational power source VDD is supplied only to an internal CMOS circuit, through which a current does not flow in the steady state, a result of measurement of the IDDQ representing a consumed current of the power source VDD becomes a current value "0". On the other hand, when the abnormal circuit is present even one, the result of measurement of the IDDQ will not become "0". Therefore, detection of abnormality in a fabrication process becomes possible.

At this time, a ratio of number of elements in the differential input circuit in number of elements in the overall LSI becomes quite small. Therefore, effect can be sufficiently guaranteed only by performing IDDQ test for the power source VDD.

The power sources VDD and VDD1 are separated and independent. Only, in the a testing stage of the wafer in the factory, VDD and VDD1 are supplied independently from the power sources. When the LSI is mounted on a circuit board, these power sources are connected in common (step S3). Therefore, when a user uses the LSI, both power sources VDD1 and VDD can be regarded as the same power source.

In the embodiment of FIG. 1, to the gate of the transistor T2 of the differential circuit, a reference voltage Vref is supplied. The reference voltage Vref is derived as (High level+Low level of Vin))/2 and is supplied externally. Because of the differential circuit, it is also possible to supply an inverted signal of Vin.

As set forth above, according to the present invention, in the CMOS LSI loaded the GTL input circuit flowing the current even in the steady state, improvement of a LSI failure detection ratio by the IDDQ test can be achieved similarly to the prior art. By this, it becomes possible to avoid shipping of faulty product in the fabrication process. The reason is that the high potential power source of the differential circuit is separately and independently of that of other internal circuit to permit implementation of the IDDQ test in the same manner as that of the conventional IDDQ test standard.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A testing method for a semiconductor integrated circuit device including a differential circuit flowing a steady-state current, a first terminal for a high potential power source of said differential circuit, and a second terminal for a high potential power source of an internal circuit, said method comprising:

supplying power source voltage to said first terminal and said second terminal from mutually independent power sources; and performing a consumed current measuring test in said power source of said second terminal in a condition where power source voltages to said first terminal and said second terminal are supplied from said mutually independent power sources.

2. A testing method as set forth in claim 1, wherein said measuring test is a measuring test of a static consumed current.

3. A testing method as set forth in claim 2, further comprising, after completing said measurement test, connecting said first and second terminals in common.

4. A testing method as set forth in claim 3, wherein said differential circuit is an input circuit supplying an output signal of other integrated circuit to said internal circuit.

5. A testing method as set forth in claim 4, wherein said differential circuit is a gunning transceiver logic circuit.

6. A testing method as set forth in claim 5, wherein said internal circuit is a circuit of CMOS structure.

7. A testing method as set forth in claim 6, wherein said circuit of CMOS structure is a CMOS inverter.

* * * * *